United States Patent
Bauknecht et al.

(10) Patent No.: US 12,431,308 B2
(45) Date of Patent: Sep. 30, 2025

(54) RELAY APPARATUS AND SAFETY SWITCHING DEVICE WITH RELAY APPARATUS

(71) Applicant: Pilz GmbH & Co. KG, Ostfildern (DE)

(72) Inventors: Jochen Bauknecht, Ostfildern (DE); Florian Rotzinger, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 161 days.

(21) Appl. No.: 18/446,860

(22) Filed: Aug. 9, 2023

(65) Prior Publication Data

US 2024/0079193 A1    Mar. 7, 2024

(30) Foreign Application Priority Data

Sep. 6, 2022 (DE) .................. 10 2022 122 527.5

(51) Int. Cl.
*H01H 47/00* (2006.01)
*G01R 31/327* (2006.01)
(Continued)

(52) U.S. Cl.
CPC ....... *H01H 47/002* (2013.01); *G01R 31/3278* (2013.01); *H01H 47/22* (2013.01); *H01H 50/18* (2013.01); *H01H 50/54* (2013.01)

(58) Field of Classification Search
CPC ...... H01H 47/002; H01H 47/22; H01H 50/18; H01H 50/54; H01H 51/20;
(Continued)

(56) References Cited

U.S. PATENT DOCUMENTS

| | | | |
|---|---|---|---|
| 2012/0139360 A1* | 6/2012 | Juhrig | G05B 9/02 307/112 |
| 2018/0005788 A1* | 1/2018 | Pullmann | H01H 47/005 |
| 2018/0175604 A1* | 6/2018 | Pullmann | H03K 17/97 |

FOREIGN PATENT DOCUMENTS

| | | |
|---|---|---|
| DE | 9209170 U1 | 11/1992 |
| DE | 4409541 A1 | 9/1995 |

(Continued)

OTHER PUBLICATIONS

European Search Report with English translation in European Application No. 23187603.8, dated Feb. 5, 2024, 6 pages.

*Primary Examiner* — Danny Nguyen
*Assistant Examiner* — Nicolas Bellido
(74) *Attorney, Agent, or Firm* — Edell, Shapiro & Finnan, LLC

(57) ABSTRACT

A relay apparatus comprises input ports, output ports, and first and second relays. The first relay comprises: a first contact group comprising $n \geq 2$ first contacts arranged in parallel and moveable between open and closed positions by a first common armature; and a second contact group comprising n second contacts arranged in parallel and movable between open and closed positions by a second common armature, wherein the first and second contacts are arranged in series in pairs. The second relay includes $m < n$ contacts arranged in parallel and moveable between open and closed positions by a third common armature. The first and second relays are arranged in series between the input and output ports such that the relay apparatus has plural parallel switching paths. A contact of the second relay is arranged in series with a first contact of the first contact group in m switching paths.

6 Claims, 3 Drawing Sheets

(51) Int. Cl.
*H01H 47/22* (2006.01)
*H01H 50/18* (2006.01)
*H01H 50/54* (2006.01)

(58) Field of Classification Search
CPC ........... H01H 2300/026; H01H 47/005; H01H 50/44; H01H 50/541; G01R 31/3278; H03K 19/0075
See application file for complete search history.

(56) References Cited

FOREIGN PATENT DOCUMENTS

| | | | |
|---|---|---|---|
| DE | 102004033359 A1 | | 2/2006 |
| DE | 102015104211 A1 | | 9/2016 |
| EP | 0213064 A2 | | 3/1987 |
| WO | WO-2006002725 A1 * | 1/2006 | ........... H01H 47/004 |

* cited by examiner

RELAY APPARATUS AND SAFETY SWITCHING DEVICE WITH RELAY APPARATUS

CROSS REFERENCE TO RELATED APPLICATIONS

This application claims priority under 35 U.S.C. § 119 (a)-(d) to German application No. 10 2022 122 527.5 filed on Sep. 6, 2022, the entire contents of which are hereby incorporated by reference.

TECHNICAL FIELD

The present disclosure relates to a relay apparatus and a safety switching device with a relay apparatus.

BACKGROUND

Relay apparatuses are already known in a variety of embodiments from the prior art. One area, in which such relay apparatuses are used, is, in particular, safety switching devices, by which at least one electrical load, connected to the safety switching devices, or a consumer connected to the safety switching devices, can be switched off in a fail-safe manner. Such safety switching devices are typically used to switch off an automated technical system, the operation of which can pose a risk to the life and limb of people, in a fail-safe manner or else to bring such a technical system into a non-hazardous state. In this context the term fail-safe means that the shutdown of the potentially hazardous system has to be ensured even if a fault occurs in the safety-relevant components of the system, including the safety switching device, for example, due to a component failure or damage to a cable. Therefore, safety switching devices are subject to special requirements, which are defined in the relevant standards for machine safety, such as, for example, ISO 13849, IEC 61508, etc. Since these standards define different requirements depending on the degree of risk, safety switching devices in terms of the present disclosure are to be, in the following, primarily such devices that ensure a single fault safety within the meaning of SIL3, according to IEC 61508, and/or PL e, according to ISO 13849, when safely switching off an electrically operated machine.

Typical applications are the shutdown of an automated machine in response to an emergency stop switch being pushed and/or when a safety door is opened. From a functional point of view, emergency stop switches and safety doors form signal generators, the signals of which can be processed and evaluated by the safety switching device. Other signal generators may be, for example, light barriers, light grids and the like or monitoring circuits that monitor a process variable, such as, for example, a rotational speed, an electric current, an electric voltage, etc., for compliance with specified limit values.

The safety switching device is used to evaluate the signal, which is generated by the signal generator and which forms an input signal from the point of view of the safety switching device, in a fail-safe manner and, as a function thereof, to generate a switch-off signal to switch off at least one electrical load or consumer in a fail-safe manner. Therefore, generic safety switching devices generally have a multi-channel, redundant design and, in addition, conduct regular internal and/or external function tests that ensure the necessary fail-safety. In many countries, safety switching devices, as defined in the present disclosure, require certification by an approved testing authority, such as, for example, the TÜV [=Technical Inspection Association] or the professional associations in Germany, that certifies compliance with safety-related design principles.

DE 10 2004 033 359 A1 discloses an apparatus for switching off an electrical consumer, in particular, an electrically driven machine, in a fail-safe manner. This apparatus has a safety switching device and a relay apparatus of the type mentioned in the introduction. The safety switching device is designed to switch two external switching elements, which are arranged at a distance from the safety switching device, from an electrically conducting state to a blocking state (and vice versa) with a time shift relative to one another. For this purpose, the relay apparatus has a first relay with a number n 2 of positively driven normally closed contacts, which are arranged parallel to each other and which can be moved from the open position into the closed position (and vice versa) by a common armature. Furthermore, the relay apparatus has a second relay with a number $m \leq n$ of positively driven normally closed contacts, which can be moved from the open position into the closed position (and vice versa) by a common armature. The normally closed contacts of the second relay are arranged electrically in series with a number m of the normally closed contacts of the first relay. As a result, the relay apparatus provides a number of parallel switching paths that can be switched with a time shift relative to one another, so that, for example, at least two external electrical switching elements (electrical loads) can be switched from an electrically conducting (closed) state to a blocking (open) state with a time shift relative to one another. It is also possible, via the relay apparatus presented here, to switch two different parts of a machine or technical system with a time shift. For example, a control unit can then be switched on; and with a time shift relative thereto a robot can be activated.

This relay apparatus, which is known from the prior art before the filing date of the present disclosure, and the safety switching device, which is provided with such a relay apparatus, have the drawback that those switching paths that are provided with only one relay are not reliable.

SUMMARY

The object of the present disclosure is to provide a relay apparatus and a safety switching device of the type mentioned in the introduction such that they can be implemented in a compact and cost-effective manner and that all of their switching paths are reliable.

A relay apparatus described herein is characterized in that the first relay is designed as a dual armature relay and has a number of positively driven normally closed contacts that corresponds to the number of normally closed contacts of the first normally closed contact group. The positively driven normally closed contacts, which are arranged parallel to one another, form a second normally closed contact group and can be moved from an open position into a closed position (and vice versa) by a second common armature. In this case the normally closed contacts of the first normally closed contact group and the normally closed contacts of the second normally closed contact group are arranged electrically in series in pairs.

Thus, the design of the first relay as a dual armature relay exhibiting the aforementioned features offers, inter alia, safety advantages, because all of the moveable parts of the first relay, which is designed as a dual armature relay, in particular, the normally closed contacts, are implemented twice. This redundancy significantly increases the operating safety of the first relay as compared to that of the prior art.

In addition, a dual armature relay needs less space and is more cost effective than two separate relays arranged electrically in series. The external wiring complexity is less in a dual armature relay, since fewer electrical switching contacts have to be wired together. In addition, a dual armature relay needs less installation space, since the technical functions of two relays, arranged electrically in series with one another, are implemented in one component. The first relay and the second relay can be activated advantageously such that a switch-on delay and a switch-off delay for several electrical loads or consumers, which are connected to the relay apparatus, can be implemented in a simple way.

In one advantageous embodiment it is proposed that the relay apparatus comprise a first relay coil, which is electromagnetically coupled to the first armature of the first relay, and a second relay coil, which is electromagnetically coupled to the second armature of the first relay. Therefore, in this embodiment each of the two armatures of the dual armature relay is assigned a relay coil, by which a sliding motion of the associated armature can be initiated due to the electromagnetic coupling.

In one particularly advantageous embodiment, it is provided that the relay apparatus comprises a relay coil that is electromagnetically coupled to the first armature of the first relay and to the second armature of the first relay. Since in this embodiment only a single relay coil is provided that is assigned to both armatures of the dual armature relay, the result is not only advantages in terms of the space requirement, but also cost related advantages due to the dispensing with an additional relay coil. Thus, the relay apparatus can be designed more compact overall.

In one embodiment, there is the possibility that the relay apparatus has a number of input ports that is smaller than the number of output ports. In this embodiment, at least one input port shares at least two output ports.

In one preferred embodiment, the first relay comprises a first positively driven normally open contact, which is designed to detect the switching positions of the normally closed contacts of the first normally closed contact group, and a second positively driven normally open contact is designed to detect the switching positions of the normally closed contacts of the second normally closed contact group. Therefore, the switching positions of the normally closed contacts of the first relay can be checked very easily; and possible faults, such as, for example, normally closed contacts sticking, are detected very easily.

Preferably, the normally open contacts of the first relay can be arranged electrically in series.

In another advantageous embodiment, the second relay comprises a positively driven normally open contact that is designed to detect the switching positions of the normally closed contacts of the second relay. As a result, the switching positions of the normally closed contacts of the second relay can be checked very easily; and possible faults, such as, for example, normally closed contacts sticking, are detected.

A safety switching device described herein is characterized in that the relay apparatus is designed and that the evaluation and control unit is designed to activate the first relay and the second relay with a time shift relative to one another.

Thus, a safety switching device is provided that provides a switch-on and switch-off delay for several electrical loads and that, compared to the prior art, has improved safety properties due to the use of the novel relay apparatus, where the first relay is designed as a dual armature relay.

It should be stressed at this point that the field of application of the disclosed relay apparatus is not limited to the described safety switching device. The disclosed relay apparatus can be used wherever there is the need from a technical point of view to provide switch-on delays and/or switch-off delays for several electrical loads or consumers.

It is also possible, via the relay apparatus presented here, to switch two different parts of a machine or technical system with a time shift. For example, a control unit can then be switched on; and with a time shift relative thereto a robot can be activated. Then the control unit and the robot form two consumers for the purpose of the present disclosure.

BRIEF DESCRIPTION OF THE DRAWINGS

Other features and advantages of example embodiments of the disclosed relay apparatus and safety switching device are described below with reference to the drawings. In this case the same reference numerals are used for identical or similar parts and for parts with identical or similar functions.

DETAILED DESCRIPTION

It is not necessary for the disclosed safety switching device 100 and relay apparatus 1 to exhibit all of the features described below. It is also possible that a safety switching device 100 and a relay apparatus 1 exhibit only individual features of the example embodiments, described below.

Figure 1:
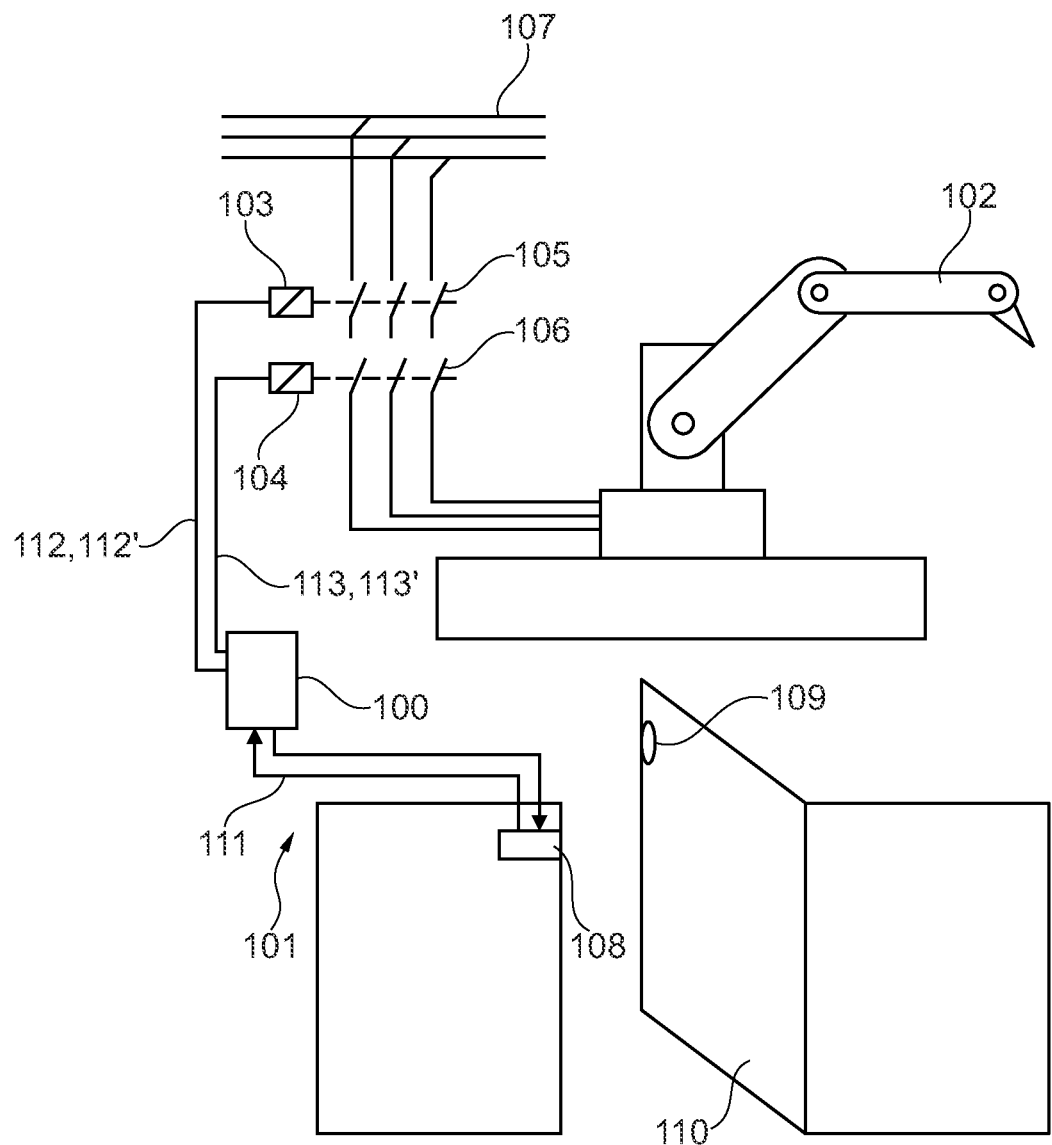
FIG. 1 is a schematic diagram of a technical system that is provided with a safety switching device that is designed according to an example embodiment of the present disclosure.

FIG. 1 shows a technical system 101 that comprises an automated robot 102 in this example embodiment. In operation, the robot 102 executes motions that can endanger people in the danger zone of the robot 102. In order to ensure a safe operation of the robot 102, the technical system 101 has a safety switching device 100. The safety switching device 100 is designed, in general, to switch off several electrical loads or consumers in a fail-safe manner. The electrical loads, which are used in the technical system 101, can be, for example, electrical drives, contactors 103, 104 or valves, such as solenoid valves.

In the present case, the safety switching device 100 is designed such that it can activate at least two external switching elements—thus, electrical loads in the aforementioned sense—on the output side. In this example embodiment, the external switching elements are designed as contactors 103, 104. The contactors 103, 104 each have a number of switching contacts 105, 106 that are preferably positively driven. This means that the switching contacts 105, 106 of each individual contactor 103, 104 are mechanically coupled to one another such that they are forced to assume the same switching position (open or closed). In the example embodiment shown here, the switching contacts 105 of the first contactor 103 are arranged in series with the switching contacts 106 of the second contactor 104 in a power supply path 107 of the robot 102.

On the input side, the safety switching device 100 is connected to at least one signal generator 108, which is designed as a safety door switch in the example embodiment, shown in FIG. 1. The safety door switch 108 interacts with an actuator 109, which is attached to a safety door 110.

When the safety door 110 is closed, the actuator 109 is in the spatial vicinity of the safety door switch 108, a state that the safety door switch 108 can detect, for example, by an inductive, capacitive, magnetic, mechanical or other coupling. Then, the safety door switch 108 sends a corresponding input signal 111, which represents the state of the closed safety door 110, to the safety switching device 100.

When, on the other hand, the safety door 110 is open, the actuator 109 is no longer in the vicinity of the safety door switch 108, which then generates an input signal 111 that represents a safety requirement due to the safety door 110 being now open. As soon as the safety switching device 100 recognizes this safety requirement or when a device fault is detected as a result of an internal function test, the safety switching device 100 switches off the two contactors 103, 104 with the aid of its multi-channel switch-off signal 112, 113. The result is that the switching contacts 105, 106 in the power supply path 107 of the robot 102 drop out and are opened. As a result, the robot 102 is switched off.

Figure 2:
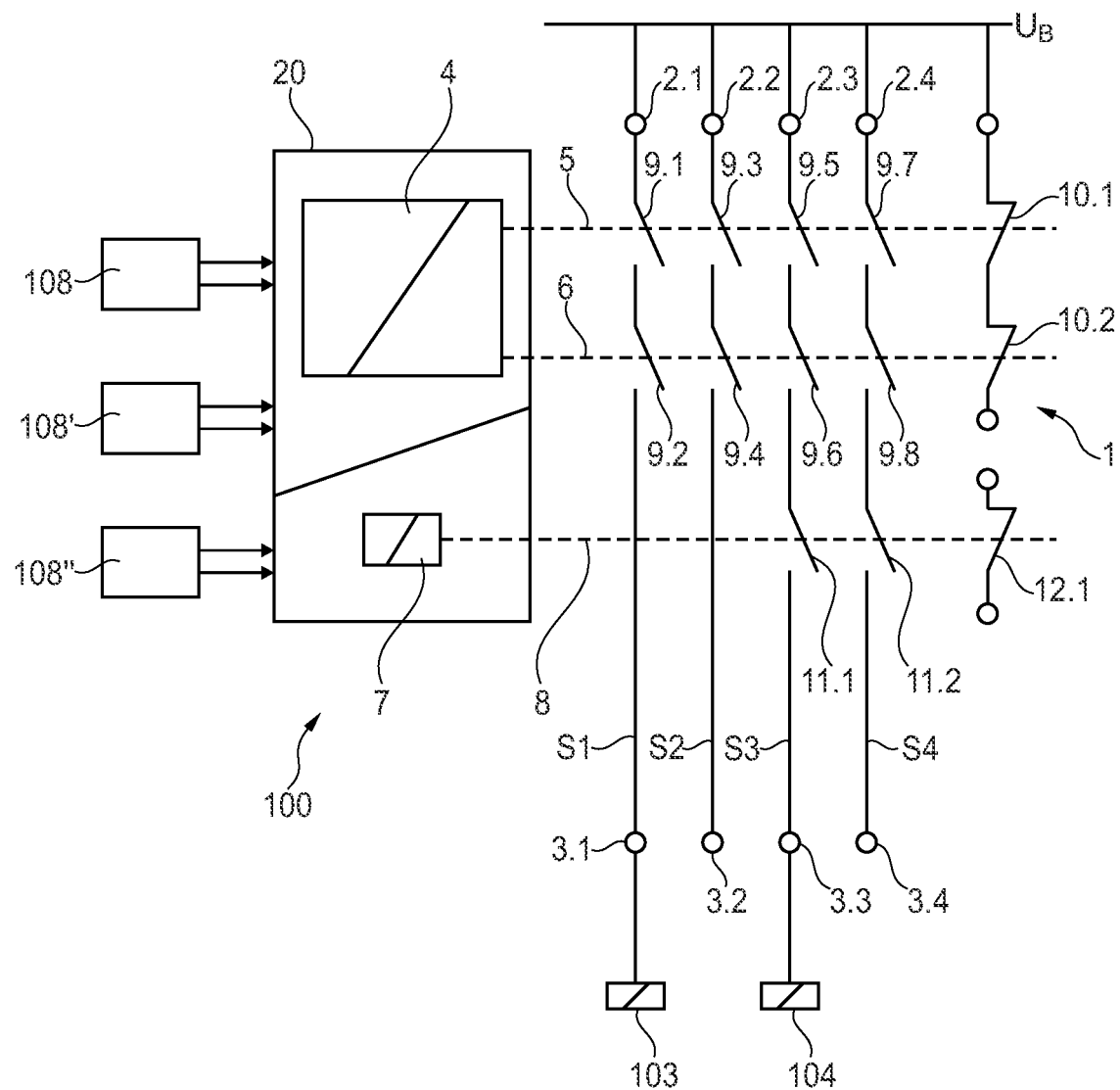
FIG. 2 is a safety switching device with a relay apparatus that is designed according to a first example embodiment of the present disclosure.
Figure 3:
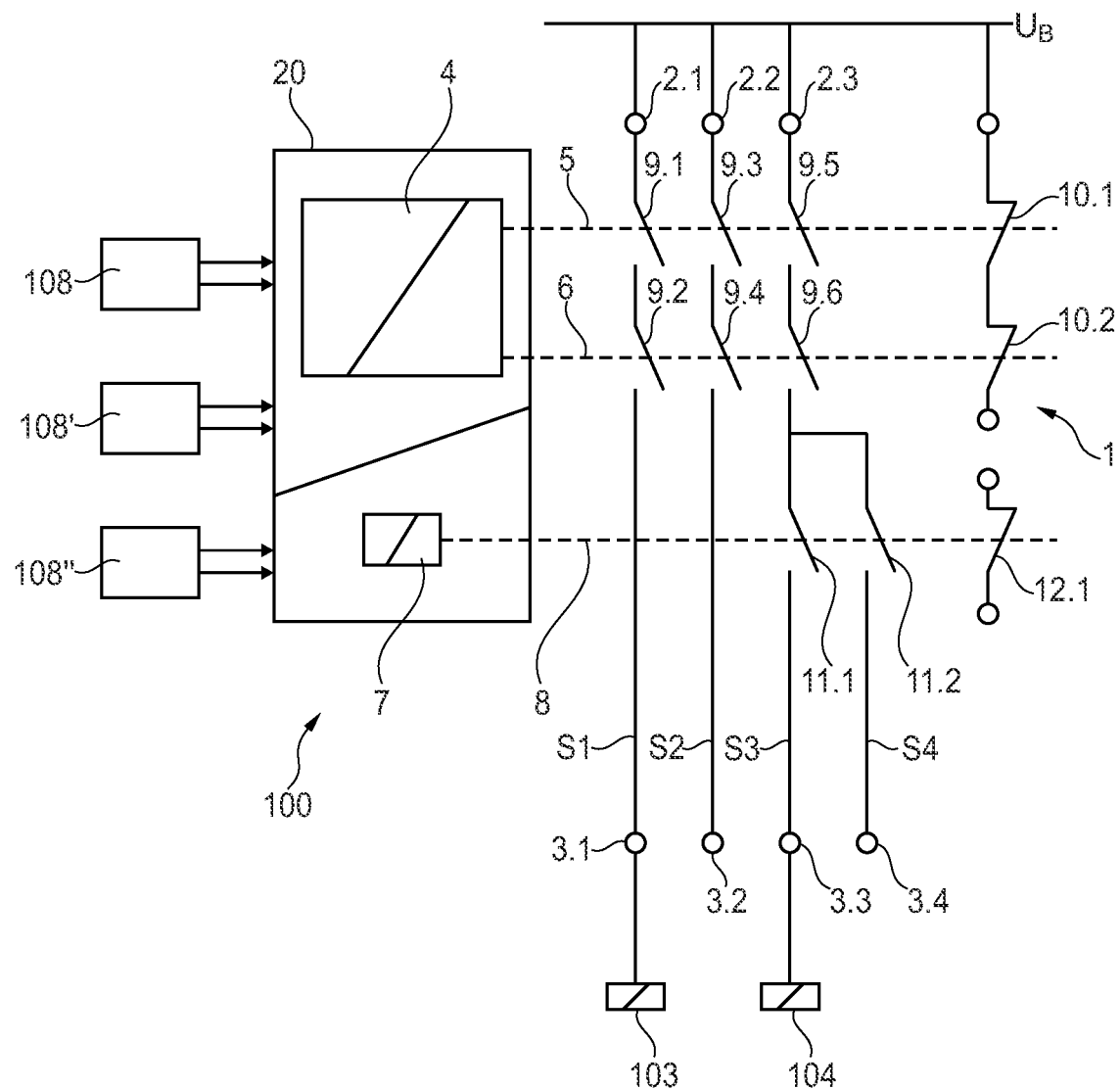
FIG. 3 is a safety switching device with a relay apparatus that is designed according to a second example embodiment of the present disclosure.

In the present case, the safety switching device 100 is designed to be relay-based and has contact-based, potential-free outputs. FIGS. 2 and 3 show two example embodiments of the safety switching device 100. A central module of the two safety switching devices 100 is in each case a relay apparatus 1 that is designed differently in the two example embodiments.

With reference to FIG. 2, the safety switching device 100 comprises a relay apparatus 1 and an evaluation and control unit 20 that is designed to receive and evaluate one or more input signals from the signal generators 108, 108', 108", which are connected to the safety switching device 100, and to activate the relay apparatus 1.

In addition to the safety door switch 108, shown as an example in FIG. 1, the signal generators 108, 108', 108" may be, for example, emergency stop switches 108', light barriers or light grids 108", two-hand switches, interlock switches or also signals from monitoring devices for rotational speed, voltage, current, or the like. The input signal(s) is/are fed to the evaluation and control unit 20 that has preferably a multi-channel, redundant design, in order to increase the fault safety. This aspect is symbolized by the diagonal dividing line of the evaluation and control unit 20 in FIG. 2. The evaluation and control unit 20 may be, for example, a circuit that is made up of discrete components. As an alternative, the evaluation and control unit 20 can also be implemented with the aid of microcontrollers and/or other highly integrated components.

In this example embodiment, the relay apparatus 1 of the safety switching device 100 according to FIG. 2 comprises altogether four input ports 2.1-2.4 and four output ports 3.1-3.4, so that in total four parallel switching paths S1-S4 are provided. Furthermore, the relay apparatus 1 comprises a first output-sided relay 4, which is designed as a dual armature relay with two armatures 5, 6, and a second output-sided relay 7, which has an armature 8. The switching positions of the two relays 4, 7 are determined by the evaluation and control unit 20.

Each of the two relays 4, 7 has a number of positively driven normally closed contacts 9.1-9.8, 11.1, 11.2 and normally open contacts 10.1, 10.2, 12.1. In the four switching paths S1-S4, some of the normally closed contacts 9.1-9.8 of the first relay 4 and the normally closed contacts 11.1, 11.2 of the second relay 7 are arranged electrically in series with one another between the input ports 2.1-2.4 and the output ports 3.1-3.4 in a manner that shall be explained in greater detail below.

In the present case, the evaluation and control unit 20 is designed such that it can activate the relays 4, 7 with a time shift relative to one another, at least when the electrical loads, formed by the contactors 103, 104, are switched off, so that a switch-off delay is provided. Preferably the reactivation of the contactors 103, 104 also takes place with a time shift relative to one another so that a switch-on delay is also provided.

In this example embodiment, the first relay 4 has in total eight positively driven normally closed contacts 9.1-9.8 and two positively driven normally open contacts 10.1, 10.2. As can be seen from the drawing according to FIG. 2, the normally closed contacts 9.1-9.8 are arranged in each case electrically in series in pairs. The two normally open contacts 10.1-10.2 are also arranged electrically in series. In this way, each of the pairs of normally closed contacts in each of the four switching paths S1-S4 results in a redundancy of the relevant normally closed contacts 9.1-9.8 of the first relay 4, a feature that is particularly advantageous in terms of safety aspects.

The movement of the two armatures 5, 6 of the first relay 4 can be initiated by a common relay coil, which is not explicitly illustrated here. In some applications each of the two armatures 5, 6 can also be assigned its own relay coil.

The first armature 5 pushes a first normally closed contact group, which consists of the normally closed contacts 9.1, 9.3, 9.5, 9.7 and the normally open contact 10.1 in the example embodiment, shown here. The second armature 6 pushes a second normally closed contact group, which consists of the normally closed contacts 9.2, 9.4, 9.6, 9.8 and the normally open contact 10.2 in the example embodiment shown here.

The second relay 7, which is arranged electrically in series with the first relay 4, has two positively driven normally closed contacts 11.1, 11.2 and a normally open contact 12.1, both of which are pushed by an armature 8. The movement of the armature 8 of the second relay 7 is initiated by a relay coil, which is also not explicitly illustrated.

As already mentioned above, the relay apparatus 1 in this example embodiment provides in total four parallel switching paths S1-S4.

A first switching path S1 is formed by the first input port 2.1; the two normally closed contacts 9.1, 9.2 of the first relay 4, the normally closed contacts being arranged electrically in series; and the first output port 3.1. A second switching path S2 is formed by the second input port 3.2; the two normally closed contacts 9.3, 9.4 of the first relay 4, the normally closed contacts being arranged electrically in series; and the second output port 3.2. A third switching path S3 is formed by the third input port 2.3; the two normally closed contacts 9.5, 9.6 of the first relay 4, the normally closed contacts being arranged electrically in series; the normally closed contact 11.1 of the second relay 7; and the third output port 3.3. A fourth switching path S4 is formed by the fourth input port 2.4; the two normally closed contacts 9.7, 9.8 of the first relay 4, the normally closed contacts being arranged electrically in series; the normally closed contact 11.2 of the second relay 7; and the fourth output port 3.4.

Applied to the input ports 2.1-2.4 of the relay apparatus 1 is an operating voltage UB, which is required to operate the two contactors 103, 104. For example, an operating voltage UB=24 V can be applied to the input ports 2.1-2.4. In the present case, the first contactor 103 is connected to the first output port 3.1 on the output side and, thus, to the first switching path S1 of the relay apparatus 1 of the safety switching device 100. The second contactor 104 is connected to the third output port 3.3 and, thus, to the third switching path S3 of the relay apparatus 1.

As a result of the possibility of activating the two relays 4, 7 with a time shift and because of the separate outwards routing of the corresponding output ports 3.1, 3.3, to which the contactors 103, 104 are connected in this example embodiment, it follows that during shutdown the switching contacts 105, 106 of the contactors 103, 104 are also opened with a time shift relative to one another.

The additionally provided normally open contacts 10.1, 10.2, 12.1 of the two relays 4, 7 make it possible in an advantageous manner to check separately the respective switching positions of the normally closed contacts 9.1-9.8 of the first relay 4 and the normally closed contacts 11.1, 11.2 of the second relay 7. Because, as a result of the contacts being positively driven, the normally open contacts 10.1, 10.2, 12.1 of the relays 4, 7 are opened, when the normally closed contacts 9.1-9.8, 11.1, 11.2 of the relevant relays 4, 7 are closed, and vice versa. A fault, such as, for example, the sticking of one of the normally closed contacts 9.1-9.8, 11.1, 11.2 of the two relays 4, 7, can be easily detected in this way, since the associated normally open contact 10.1, 10.2, 12 does not change its switching position. This behavior can be evaluated, for example, very easily by the evaluation and control unit 20 by connecting the input ports and the output ports of the relevant normally open contacts 10.1, 10.2, 12.1 to the evaluation and control unit 20 of the safety switching device 100.

The switching behavior of the safety switching device 100 that has a direct effect on the switching behavior of the contactors 103, 104, connected to the safety switching device, shall be explained in greater detail below. It is to be assumed that the safety door 110 of the safety switching device 100 is closed in a first state and is open in a second state.

In each of the two states a corresponding input signal 111 is generated by the signal generator 108 and fed to the safety switching device 100. The input signal 111 is processed and evaluated by the evaluation and control unit 20 in a fail-safe manner so that the two relays 4, 7 can be activated correspondingly.

In the first state, which represents the closed safety door 110, the input signal 111 goes into a first (active) voltage state U1 (for example, U1>0 V). If now the safety door 110 is opened by a user (second state) and/or there is a defect in the signal chain between the safety switching device 100 and the signal generator 108, the input signal 111 goes into a second voltage state U2, which is different from the first voltage state U1 (for example, U2=0 V).

The safety switching device 100 is designed to evaluate in a fail-safe manner the input signal 111 in a manner known per se by the evaluation and control unit 20 and to generate, as a function thereof, two redundant switch-off signals 112, 113, which are time shifted relative to one another, for the contactors 103, 104. In the present case, the first switch-off signal 112 for the first contactor 103 is activated with a time shift relative to the switch-off signal 113 for the second contactor 104. Inversely, during the switch-on process the corresponding switch-on signals 112', 113' for the contactors 103, 104 are also activated with a time shift relative to one another. This aspect shall be explained in greater detail below.

For a switch-on delay the first relay 4, which is designed as a dual armature relay, is activated. This means that the positively driven normally closed contacts 9.1-9.8 of the first relay 4 are brought into the closed position by the first armature 5 and the second armature 6. The result is that the first switching path S1 and the second switching path S2 are closed, whereas the third switching path S3 and the fourth switching path S4 continue to remain open. As a result, a switch-on signal 112' (U=UB) is generated for the first contactor 103, connected to the first switching path S1. The first contactor 103 is supplied with the operating voltage UB, so that the associated switching contacts 105 are closed.

After the elapse of a preset or presettable switch-on delay time, the second relay 7 is activated. This means that the positively driven normally closed contacts 10.1, 10.2 of the second relay 7 are brought into the closed position by the associated armature 8. The result is that then the third switching path S3 and the fourth switching path S4 are also closed. As a result, a switch-on signal 113' (U=UB) is generated for the second contactor 104, connected to the third switching path S2. The second contactor 104 is supplied with the operating voltage UB, so that the associated switching contacts 106 are also closed.

After all of the switching contacts 105, 106 of the contactors 103, 104 in the power supply path 107 of the robot 102 have been closed, the robot 102 can then be put into operation, since it is supplied with power.

For the provision of a switch-off delay, the second relay 7 is then deactivated. The positively driven normally closed contacts 10.1, 10.2 of the second relay 7 are opened. As a result, the third switching path S3 and the fourth switching path S4 are interrupted; and a switch-off signal 113 (e.g., U=0 V) for the second contactor 104 is generated. The effect is that the associated switching contacts 106 in the power supply path 107 of the robot 102 are opened. As a result, the power supply of the robot 102 is interrupted, so that the robot is put out of service. After the elapse of a preset or presettable switch-off delay time, the normally closed contacts 9.1-9.8 of the first relay 4 are then opened. As a result, the first switching path S1 and the second switching path S2 are interrupted; and a switch-off signal 112 (e.g., U=0 V) for the first contactor 103 is generated. The effect is that the associated switching contacts 105 in the power supply path 107 of the robot 102 are also opened.

When in the event of a fault, in particular, when one of the normally closed contacts 11.1, 11.2 sticks, the second relay 7 can no longer switch, this state is detected by the normally open contact 12.1 of the second relay 7. The safety switching device 100 is designed advantageously such that the first relay 4 is switched off when such a fault occurs.

With reference to FIG. 3, a second example embodiment of a safety switching device 100 with a relay apparatus 1 shall be explained below in greater detail. The basic design and the operating principle correspond to that of the first example embodiment, so that only the differences shall be explained below.

In this example embodiment, the relay apparatus 1 of the safety switching device 100 comprises in total three input ports 2.1-2.3 and four output ports 3.1-3.4. As can be seen in FIG. 3, the two parallel normally closed contacts 11.1, 11.2 of the second relay 7 share the two normally closed contacts 9.5 and 9.6, which are arranged electrically in series with one another, and, thus, also the third input port 2.3 of the first relay 4, which in turn is designed as a dual armature relay. Since the two normally closed contacts 11.1, 11.2 of the second relay 7 form a parallel circuit, the result in turn is altogether four parallel switching paths S1-S4 between the three input ports 2.1-2.3 and the four output ports 3.1-3.4. The third switching path S3 and the fourth switching path S4 share the third input port 2.3 as a common root.

As a result of the first relay 4 being designed as a dual armature relay in the two example embodiments, there are, inter alia, safety advantages, because all of the moveable parts of the first relay 4, which is designed as a dual armature relay, are implemented twice. This redundancy significantly increases the operating safety of the first relay 4 and, thus, also the entire safety switching device 100. If the first relay 4 were designed as a "simple" relay with a single normally closed contact in the first switching path S1 and a single normally closed contact in the second switching path S2, then the first switching path S1 and the second switching path S2 would not be reliable. In addition, a dual armature relay needs less space than two separate relays, which are arranged electrically in series and with which the switching functionality of the dual armature relay could also be implemented. The external wiring complexity is less in a dual armature relay, since fewer electrical switching contacts have to be wired together. In addition, a dual armature relay needs less installation space, since the technical functions of two relays, arranged electrically in series with one another, are provided in one component. The advantages in terms of the space requirement become greater when the first relay 4 has only a single relay coil for the electromagnetic interaction with the two armatures 5, 6.

When the robot 102 is switched off in a safety-oriented manner, the safety switching devices 100 presented here can be used to reach an additional level of fault safety by opening the redundant external contactors 103, 104 with a time shift relative to one another. This feature reduces the probability that the contactors 103, 104 will drop out simultaneously, thus, significantly improving the fault safety.

It should be stressed at this point that the field of application of the relay apparatuses 1 shown in FIGS. 2 and 3 is not limited to the safety switching devices 100 explicitly illustrated. The relay apparatuses 1 can be used wherever there is the need from a technical point of view to provide switch-on delays and/or switch-off delays for electrical loads or consumers. It is also possible by the relay apparatuses 1 presented here to switch two different parts of a machine or technical system that form electrical loads or consumers with a time shift. For example, a control unit can then be switched on, and with a time shift relative thereto a robot can be activated.

What is claimed is:

1. A relay apparatus, comprising:
    input ports;
    output ports;
    a dual-armature first relay comprising:
        a first contact group comprising a number n≥2 of first normally closed contacts arranged parallel to each other that are moveable between open and closed positions by a first common armature; and
        a second contact group comprising n second normally closed contacts arranged parallel to each other that are moveable between open and closed positions by a second common armature, wherein the first and second normally closed contacts are arranged electrically in series in pairs; and
    a second relay with a number m<n of normally closed contacts that are arranged parallel to each other and that are moveable between open and closed positions by a third common armature, wherein:
    the first and second normally closed contacts of the dual-armature first relay and the normally closed contacts of the second relay are positively driven,
    the dual-armature first relay and the second relay are arranged electrically in series with one another between the input ports and the output ports such that the relay apparatus has plural parallel switching paths, and
    a normally closed contact of the second relay is arranged electrically in series with a first normally closed contact of the first contact group in m switching paths.

2. The relay apparatus of claim 1, wherein the number of input ports is less than the number of output ports.

3. The relay apparatus of claim 1, wherein the dual-armature first relay comprises a first positively driven normally open contact to detect switching positions of the normally closed contacts of the first contact group of the dual-armature first relay, and a second positively driven normally open contact to detect switching positions of normally closed contacts of the second contact group.

4. The relay apparatus of claim 3, wherein the first and second positively driven normally open contacts of the dual-armature first relay are arranged electrically in series.

5. The relay apparatus of claim 1, wherein the second relay comprises a positively driven normally open contact to detect switching positions of the normally closed contacts of the second relay.

6. A safety switching device for switching off a plurality of electrical loads or consumers in a fail-safe manner, the safety switching device comprising:
    an evaluation and control unit to receive and evaluate input signals of at least one signal generator in a fail-safe manner; and
    at least one relay apparatus of claim 1, capable of being activated by the evaluation and control unit, wherein the output ports connect to the electrical loads or consumers, wherein the evaluation and control unit is designed to activate the dual-armature first relay and the second relay with a time shift relative to one another.

* * * * *